United States Patent
Chen

(10) Patent No.: US 12,432,872 B2
(45) Date of Patent: Sep. 30, 2025

(54) SERVER RACK SIDE WALL MOUNTING MECHANISM

(71) Applicant: Dell Products L.P., Round Rock, TX (US)

(72) Inventor: Yi-Hsuan Chen, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 239 days.

(21) Appl. No.: 18/074,811

(22) Filed: Dec. 5, 2022

(65) Prior Publication Data
US 2024/0188247 A1    Jun. 6, 2024

(51) Int. Cl.
H05K 7/20    (2006.01)
H05K 7/14    (2006.01)

(52) U.S. Cl.
CPC ....... H05K 7/1492 (2013.01); H05K 7/20272 (2013.01); H05K 7/20772 (2013.01)

(58) Field of Classification Search
CPC ............. H05K 7/1492; H05K 7/20272; H05K 7/20772
See application file for complete search history.

(56) References Cited

U.S. PATENT DOCUMENTS

| | | | |
|---|---|---|---|
| 9,209,622 B2 | 12/2015 | Wishman et al. | |
| 9,772,663 B2 | 9/2017 | Thul | |
| 2007/0045479 A1* | 3/2007 | Nguyen | H05K 7/1491 211/151 |
| 2007/0081308 A1* | 4/2007 | Ishida | H05K 7/1492 361/724 |
| 2008/0164794 A1* | 7/2008 | Lai | H05K 7/1488 312/298 |
| 2012/0069514 A1* | 3/2012 | Ross | H05K 7/20718 361/679.33 |
| 2015/0076976 A1* | 3/2015 | Bailey | H05K 7/1491 312/223.1 |
| 2015/0177797 A1* | 6/2015 | Butzer | G06F 1/189 713/300 |

\* cited by examiner

*Primary Examiner* — Jacob R Crum
(74) *Attorney, Agent, or Firm* — Larson Newman, LLP

(57) ABSTRACT

A server rack includes a power distribution unit, a first side panel and a second side panel. The power distribution unit is affixed to an outward side of the server rack at a rearward end of the server rack. The first side panel is located at the rearward end of the server rack and covers the first PDU. The first side panel has a first width. The second side panel has a second width, A sum of the first width and the second width is substantially equal to a depth of the server rack.

1 Claim, 6 Drawing Sheets

200

202

204

206

SERVER RACK SIDE WALL MOUNTING MECHANISM

FIELD OF THE DISCLOSURE

This disclosure generally relates to information handling systems, and more particularly relates to providing server racks with a side wall mounting mechanism.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A server rack may include a power distribution unit, a first side panel and a second side panel. The power distribution unit may be affixed to an outward side of the server rack at a rearward end of the server rack. The first side panel may be located at the rearward end of the server rack and may cover the first PDU. The first side panel may have a first width. The second side panel may have a second width. A sum of the first width and the second width may be substantially equal to a depth of the server rack.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
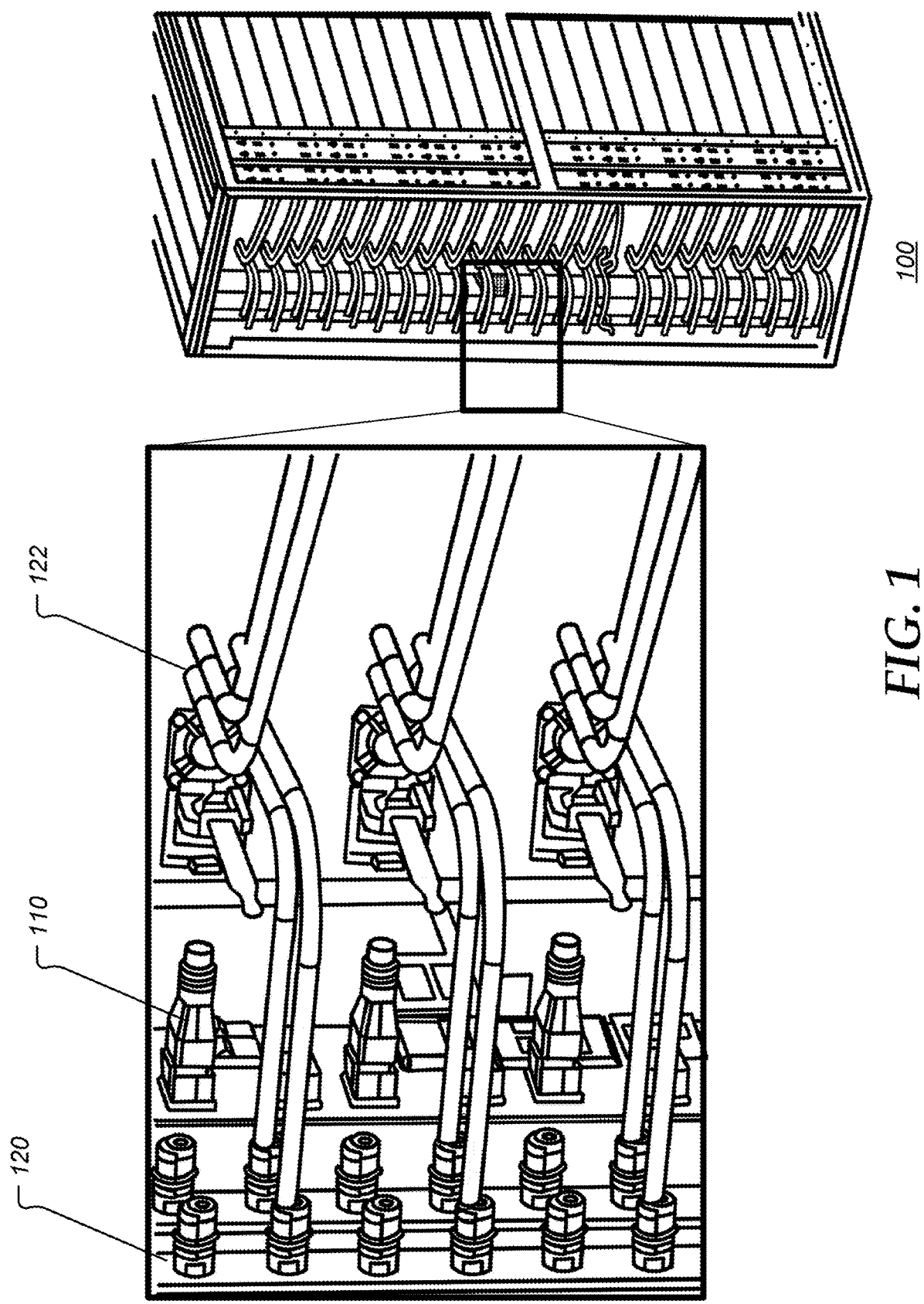
FIGS. 1-3 are various views of a server rack according to an embodiment of the current disclosure.

FIG. 1 illustrates a server rack 100, shown here in a right oblique view as viewed from the rear of the server rack. Server rack 100 represents a standardized enclosure for mounting various electronic components. In this regard, server rack 100 may represent a 19-inch rack in conformance with one or more standards, such as the Electronic Industries Alliance (EIA) standard, EIA-310-D, Cabinets, Racks, Panels, and Associated Equipment, dated September 1992, the Consumer Electronics Association (CEA) standard, CEA-310-E design requirements for Cabinets, Panels, Racks and Subracks., or the like. In another case, server rack 100 may represent other types of racks, including a 21-inch rack, a 23-inch rack, or the like. Server rack 100 is illustrated with side and rear cover panels removed.

Server rack 100 includes at least one power distribution unit (PDU) 110 and a liquid cooling manifold 120. PDU 110 represents a device affixed to the rear outside edge of server rack 100 that is connected to a main power rail of the datacenter that includes the server rack, and provide multiple power output receptacles to which the equipment installed into the server rack are plugged to receive power. Typically, server rack 100 will include two (2) PDUs 110, one (1) on each side of the server rack, or four (4) PDUs, two (2) on each side of the server rack. The details of power delivery to the components installed into a server rack, and particularly of PDUs, are known in the art and will not be further described herein, except as may be needed to illustrate the current embodiments.

Liquid cooling manifold 120 represents a portion of a liquid cooling system for cooling the components installed into server rack 200. In particular, the liquid cooling system provides a chilled liquid coolant, such as water or other coolant liquids, to liquid cooling manifold 120 and the liquid cooling manifold distributes the chilled coolant to the components via chilled coolant tubing 122. The chilled coolant passes removes the heat from the components and returns heated coolant through heated coolant tubing 122 to liquid cooling manifold 120. Typically, server rack 100 will include one (1) liquid coolant manifold 120 on one side of the server rack, or two (2) liquid coolant manifolds, one on each side of the server rack. Moreover, liquid coolant manifold 120 is typically located rearward within server rack 100 from PDU 120. The details of liquid cooling of components installed into server racks, and particularly of the distribution of liquid coolant through a liquid coolant manifold, are known in the art and will not be further described herein, except as may be needed to illustrate the current embodiments.

In a typical server rack, PDUs are mounted from the inside of the server rack to the side walls of the server rack. Further, in liquid cooled server racks, the liquid coolant manifolds are typically also mounted from the inside of the server rack to the side walls of the server rack. However, the liquid coolant manifolds are typically mounted to the rear of the PDUs. As such, access to the PDUs is typically blocked by the liquid coolant manifold and the coolant tubing. Thus, in the typical server rack, the installation, removal, or replacement of a PDU necessitates a partial disassembly of the liquid coolant system, and particularly, requires that the coolant tubing be disconnected from the liquid coolant manifold to install, remove, or replace the PDU, followed by the reassembly of the liquid coolant system. Thus, in the typical server rack, the installation, removal, or replacement of PDUs is a time consuming and laborious task. Server rack 100 resolves this problem by mounting the PDUs from the outside of the server rack, as described further below.

Figure 2:
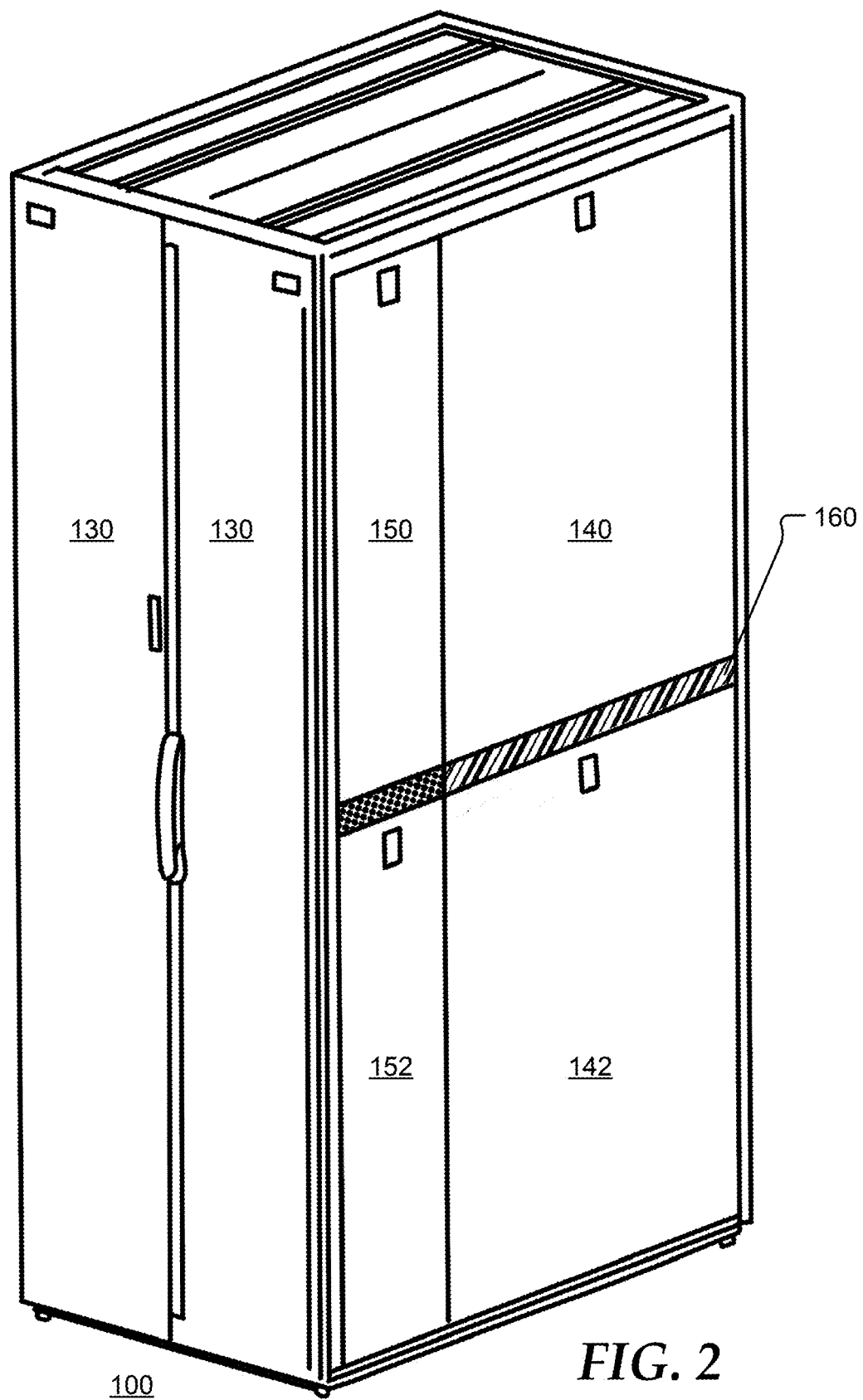

FIG. 2 illustrates server rack 100 with rear panels 330, a front upper side panel 140, a front lower side panel 142, a rear upper side panel 150, a rear lower side panel 152, and a two-piece side bracket 160 installed. A typical server rack will be understood to have a one-piece upper side panel, a one-piece lower side panel, and a one-piece side bracket. Thus, in a typical server rack, the upper and lower side panels and the side bracket are not usually understood to be removable without completely removing the server rack from the row of server racks, an operation typically associated with the complete installation, removal, or replacement of the server rack, due to the limited space between server rack rows, and the necessity to completely unplug the server rack from all power connections, network connections, or the like.

Rear upper side panel 150 has a width that is greater than or equal to the width of a typical liquid coolant manifold plus the width of two (2) PDUs, and the remaining width of server rack 100 is covered by front upper side panel 140, such that when both upper side panels 140 and 150 are installed, the entirety of the upper portion of the side of the server rack is covered. Similarly rear lower side panel 152 has a same width as rear upper side panel 150, and the remaining width of server rack 100 is covered by front lower side panel 142, such that when both lower side panels 142 and 152 are installed, the entirety of the lower portion of the side of the server rack is covered.

Figure 3:
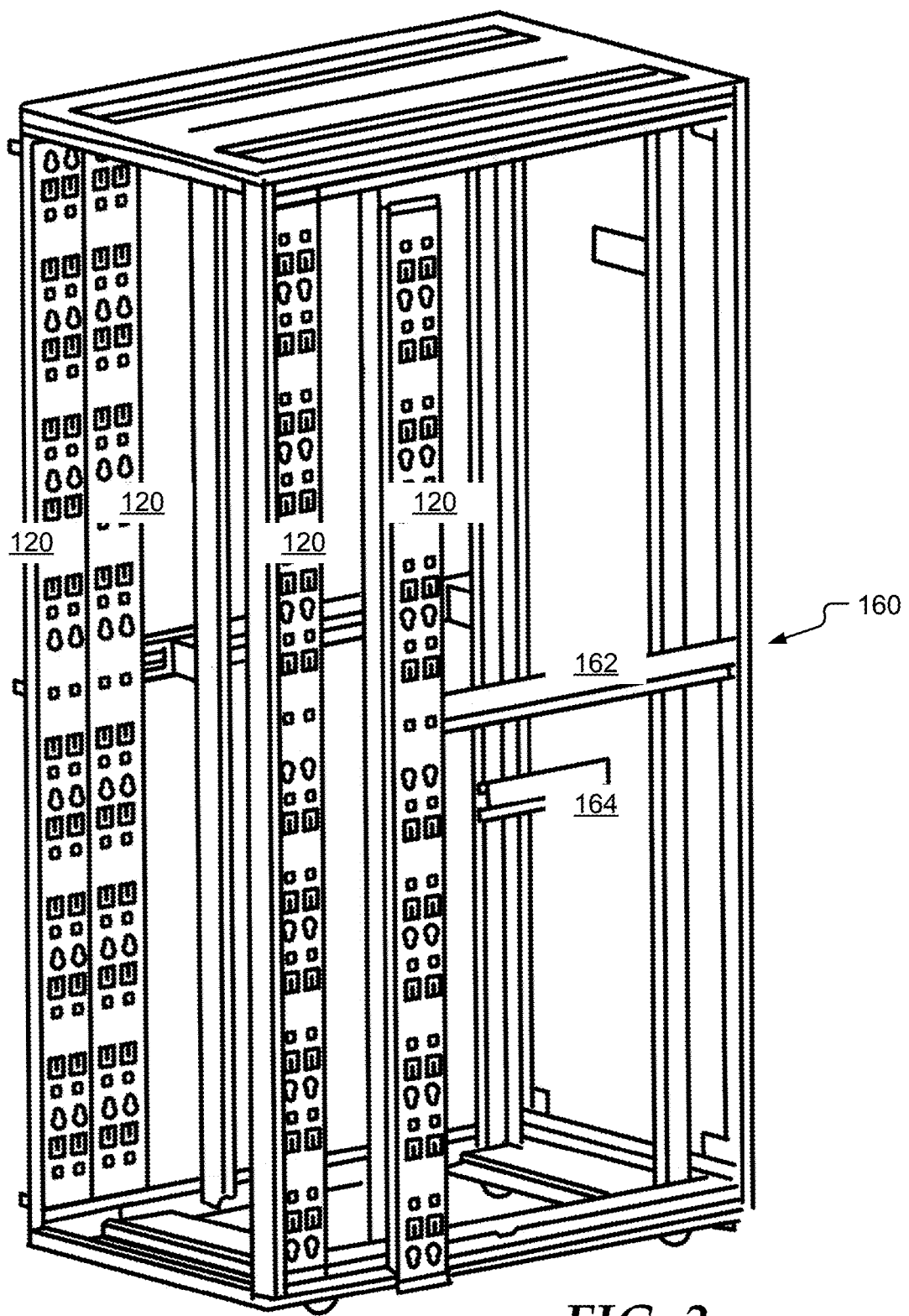

FIG. 3 illustrates server rack 100 with rear panels 330, upper side panels 140 and 150, and lower side panels 142 and 152 removed. Side bracket 160 is illustrated as including a front bracket piece 162 and a rear bracket piece 164. Rear bracket piece 164 has a same width as rear upper and lower side panels 150 and 152, and front bracket piece 162 has a width equal to the remaining width of server rack 100, such that, when both front bracket piece 162 and the rear bracket piece 164 are installed, the entirety of the width of the server rack is bracketed. Front bracket piece 162 and rear bracket piece 164 are detachably connected together such that, when connected, side bracket 160 provides structural rigidity to server rack 100, as needed or desired. However, rear bracket piece 164 can be detached from front bracket piece 162 as described below. Front bracket piece 162 and rear bracket piece 164 are rigidly connected together by any mechanism that provides the desired rigidity. For example front bracket piece 162 and rear bracket piece 164 may be connected together with screws, with nuts and bolts, or with other removable fasteners, with slot and tab structures, or with other fastening mechanisms, as needed or desired.

PDUs 120 are attached to server rack 100 from the outward side of the server rack. PDUs are rigidly attached to server rack 100 at the top and the bottom of the PDU. For example, PDU 120 may be attached to server rack 100 with screws, with nuts and bolts, or with other removable fasteners, as needed or desired. Because of the widths of upper side panel 142, lower side panel 152, and rear bracket piece 164 have dimensions as described above, it can be seen that the installation, removal, or replacement of PDUs 120 may be achieved by removing only upper side panel 142, lower side panel 152, and rear bracket piece 164, without having to remove upper side panel 140, lower side panel 150, and front bracket piece 162.

Figure 4:
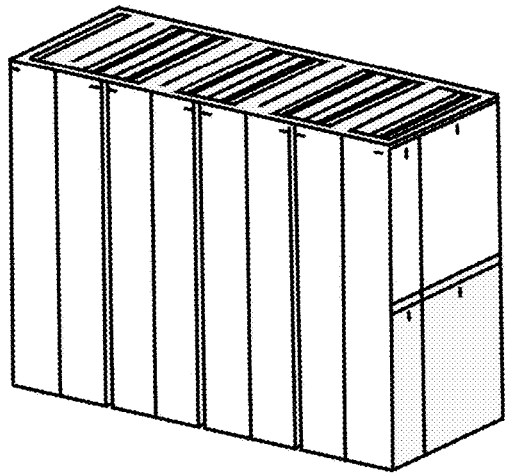
FIGS. 4 and 5 illustrate a method for removing a power distribution unit (PDU) from the server rack of FIG. 1.
Figure 4:
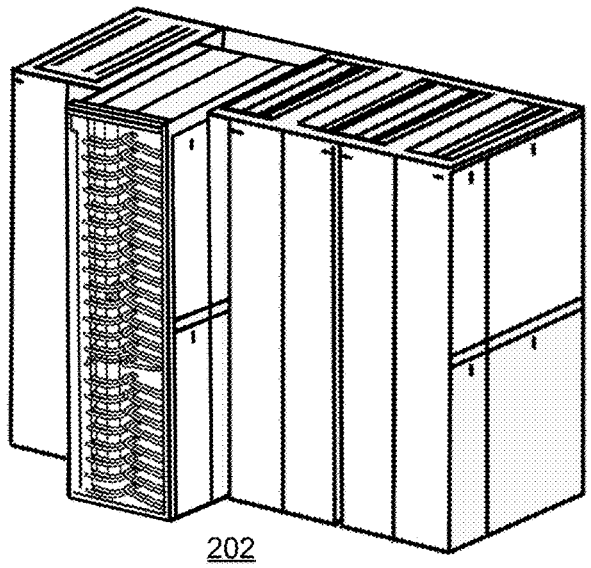
Figure 4:
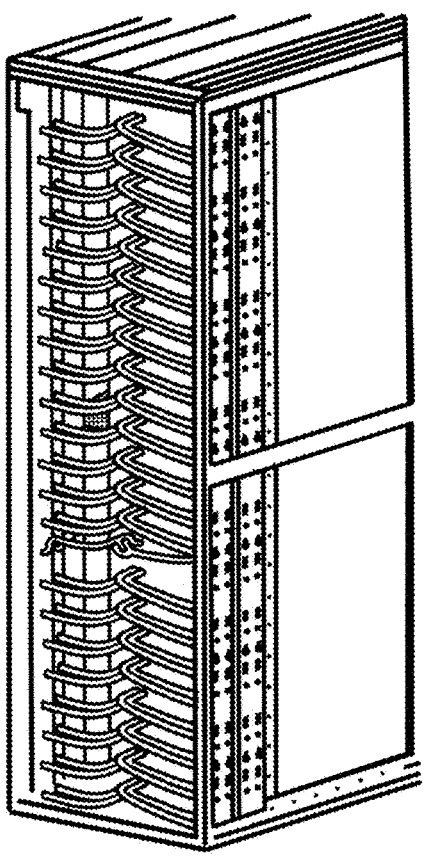
Figure 4:
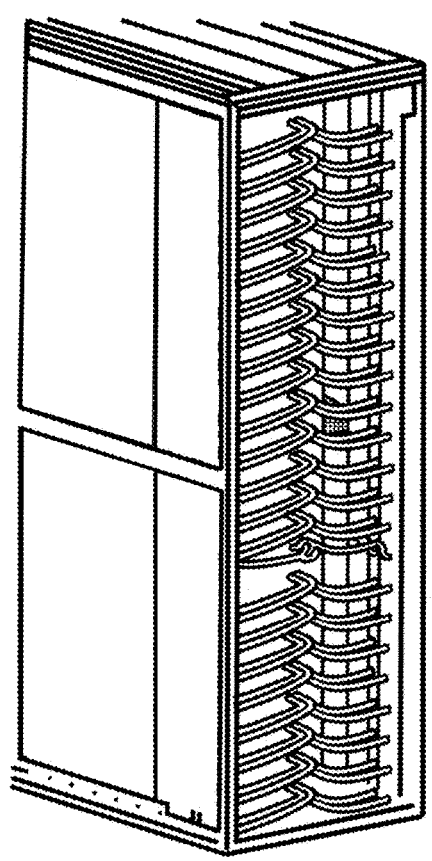
Figure 5:
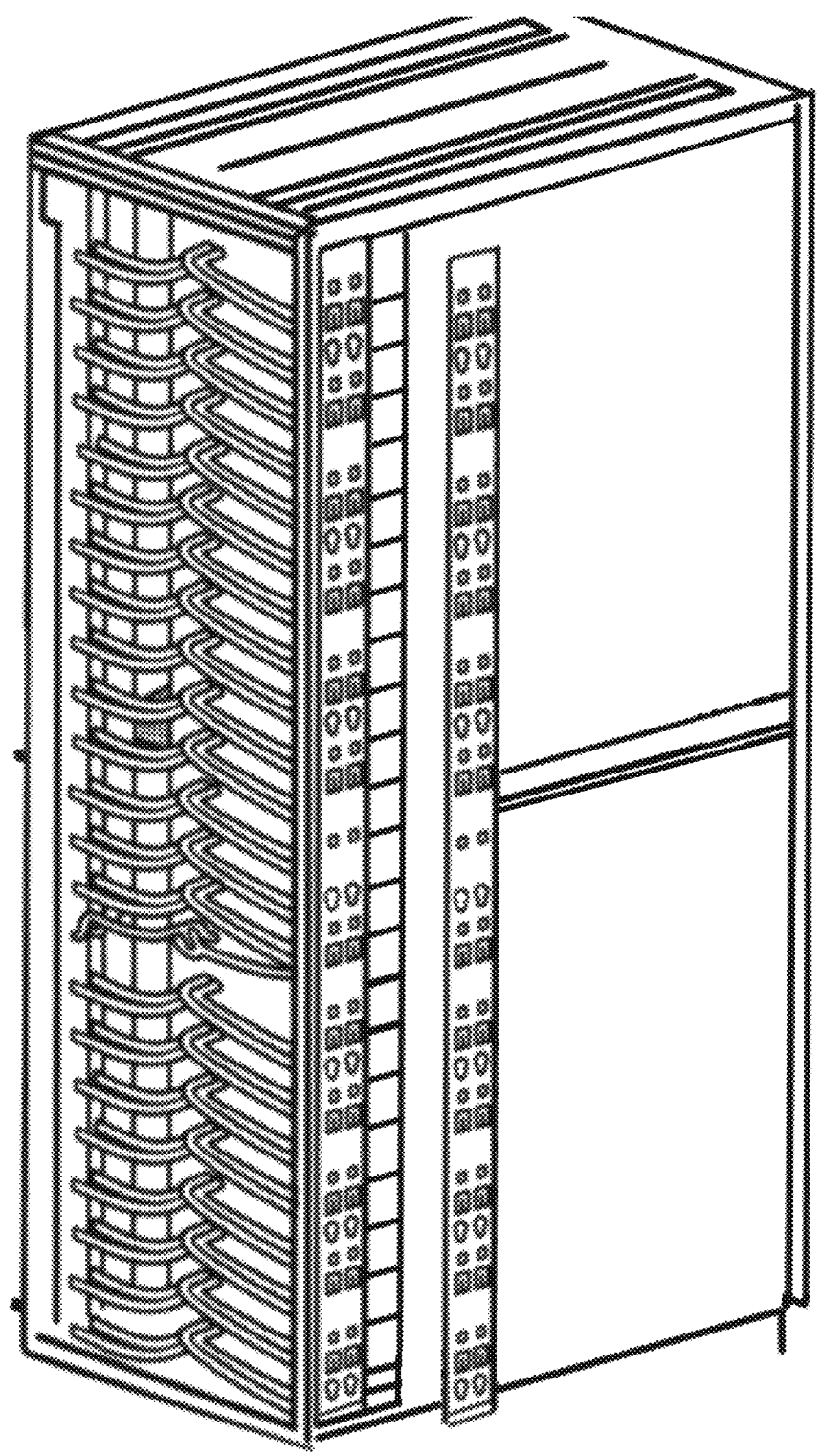

FIGS. 4 and 5 illustrate a method for removing a PDU from the a server rack. In image 200, a row of server racks is illustrated. When a PDU in a particular server rack is to be removed, the particular server rack is moved partially backward to expose the rear upper and lower side panels and the rear bracket piece, as illustrated in image 202. The particular server rack may be fitted with casters to permit the rearward movement of the server rack, as needed or desired. Where the weight of the components installed into the server rack is high, for example, over 500 kg, the server rack may be fitted with air casters that are provided with a pressurized air flow to float the server rack when movement of the server rack is needed or desired.

In a typical row of server racks, the mechanical and electrical connections to the server racks (that is, the tubing from the liquid cooling system to the liquid coolant manifolds, the power cables to the PDUs, the network cables to the components within the server racks, etc.) are typically fitted with minimum excess length. However to accommodate the rearward movement of the individual server racks, the mechanical and electrical connections to each server rack may be fitted with service loops; that is with additional length, in order to permit the rearward movement of the individual server racks to access the rear panels and rear bracket piece. In a particular embodiment, the rear panels and the rear bracket piece are all provided with a width of around 500 mm. In this case, the mechanical and electrical connections to the server racks will be provided with service loops that are long enough to permit at least 500 mm or rearward movement of the server racks.

In the remainder of the images of the method, the particular server rack is illustrated in full, for ease of illustration. However, the particular server rack remains only partially moved rearward from the row of server racks, as illustrated in images 200 and 202. In image 204 the rear upper and lower side panels and the rear bracket piece are uninstalled. In image 206, the server rack is shown in a left oblique view. In this step, the electrical plugs are unplugged from the electrical receptacles of the PDU that is to be removed. There is no need to disconnect the liquid coolant tubing to unplug the plugs from the electrical receptacles of the PDU. In image 208, the server rack is shown in the right oblique view, and the PDU is removed from the server rack from the outward side of the server rack. A method for the installation of a PDU may be performed in a reverse order to the method for removing a PDU, as needed or desired.

Other component of the server rack may be conveniently accessed when one or more PDU is removed from the outward side of the server rack, without having to disconnect the liquid coolant tubing. For example, a power supply or another module for one or more of the installed components within the server rack may be accesses from the outward side of the server rack, as needed or desired.

Figure 6:
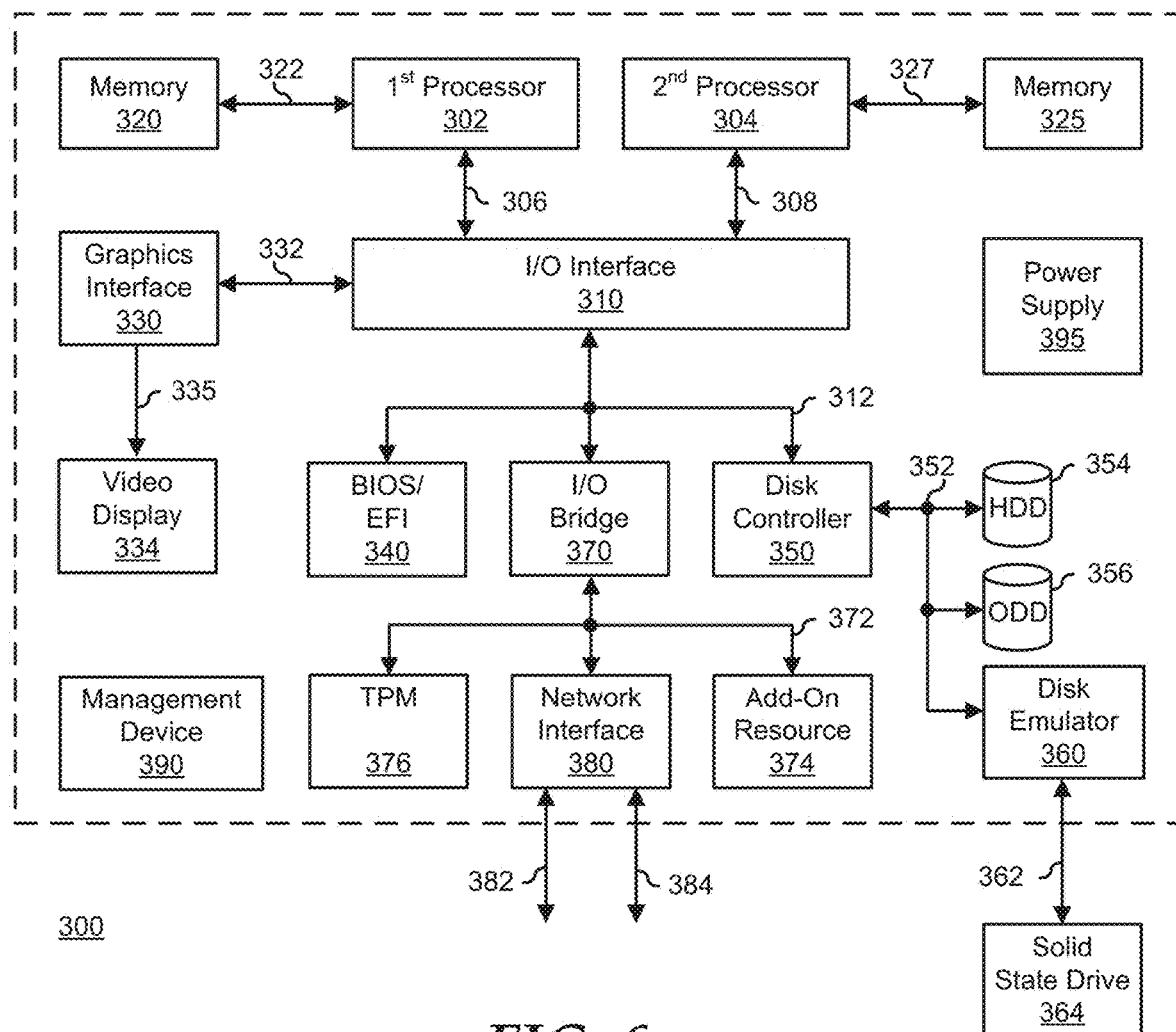
FIG. 6 is a block diagram illustrating a generalized information handling system according to another embodiment of the present disclosure.

FIG. 6 illustrates a generalized embodiment of an information handling system 300. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 362, an I/O bridge 370, one or more add-on resources 374, a trusted platform module (TPM) 376, a network interface 380, a management device 390, and a power supply 395. Processors 302 and 304, I/O interface 310, memory 320 and 325, graphics interface 330, BIOS/UEFI module 340, disk controller 350, HDD 354, ODD 356, disk emulator 360, SSD 362, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 335 to a video display 334. In a particular embodiment, information handling system 300 includes separate memories that are dedicated to each of processors 302 and 304 via separate memory interfaces. An example of memories 320 and 325 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on a separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 includes a commercially available BMC product or other device that operates in accordance with an Intelligent Platform Management Initiative (IPMI) specification, a Web Services Management (WS-Man) interface, a Redfish Application Programming Interface (API), another Distributed Management Task Force (DMTF), or other management standard, and can include an Integrated Dell Remote Access Controller (iDRAC), an Embedded Controller (EC), or the like. Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for removing a power distribution unit (PDU) from a server rack, wherein the PDU is affixed to an outward side of the server rack at a rearward end of the server rack, the method comprising:
  removing a first side panel from the server rack, the first side panel being located at the rearward end of the server rack and covering a first top portion of a side of the server rack;
  retaining a second side panel covering a second top portion of the side of the server rack;
  removing a third side panel from the server rack, the third side panel being located at the rearward end of the server rack and covering a first bottom portion of the side of the server rack;
  retaining a fourth side panel covering a second bottom portion of the side of the server rack; and
  detaching the PDU from the outward side of the server rack.

\* \* \* \* \*